United States Patent
Matsuda et al.

(10) Patent No.: US 7,564,174 B2
(45) Date of Patent: Jul. 21, 2009

(54) ACOUSTIC WAVE DEVICE AND FILTER

(75) Inventors: Takashi Matsuda, Kawasaki (JP); Shogo Inoue, Kawasaki (JP); Michio Miura, Kawasaki (JP); Satoru Matsuda, Kawasaki (JP); Masanori Ueda, Kawasaki (JP); Seiichi Mitobe, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 11/898,359

(22) Filed: Sep. 11, 2007

(65) Prior Publication Data

US 2008/0061657 A1 Mar. 13, 2008

(30) Foreign Application Priority Data

Sep. 11, 2006 (JP) .............................. 2006-245596

(51) Int. Cl.
*H03H 9/145* (2006.01)
*H03H 9/25* (2006.01)

(52) U.S. Cl. .................... 310/346; 310/313 R; 333/195

(58) Field of Classification Search ................. 310/313; 333/187–195
See application file for complete search history.

(56) References Cited

U.S. PATENT DOCUMENTS

| | | | |
|---|---|---|---|
| 4,350,916 A * | 9/1982 | August et al. ........... 310/313 B |
| 6,046,656 A * | 4/2000 | Mishima ................. 310/313 R |
| 7,310,027 B2 * | 12/2007 | Kando ......................... 333/193 |
| 2006/0164184 A1* | 7/2006 | Nakamura et al. .......... 333/195 |
| 2007/0241637 A1* | 10/2007 | Kalantar-Zadeh ....... 310/313 D |
| 2008/0129418 A1* | 6/2008 | Miura et al. ................ 333/195 |

FOREIGN PATENT DOCUMENTS

| | | |
|---|---|---|
| CN | 1225760 | 8/1999 |
| EP | 0 920 129 | 6/1999 |
| JP | 52-16146 | 2/1977 |
| JP | 61199315 A * | 9/1986 |
| JP | 8265088 | 10/1996 |
| JP | 11-31942 | 2/1999 |
| JP | 2004-312198 | 11/2004 |
| KR | 10-2003-0020016 | 3/2003 |
| KR | 10-2004-0087859 | 10/2004 |
| WO | WO 03/075458 | 9/2003 |

OTHER PUBLICATIONS

Korean Office Action, dated Sep. 24, 2008, 8 pages.
Chinese Office Action dated Feb. 20, 2009, 7 pages.

* cited by examiner

*Primary Examiner*—Jaydi SanMartin
(74) *Attorney, Agent, or Firm*—Arent Fox LLP.

(57) ABSTRACT

An acoustic wave device includes a piezoelectric substrate, a first dielectric film provided on the piezoelectric substrate, electrodes that are provided on the first dielectric film and excite an acoustic wave, and a second dielectric film that is provided so as to cover the electrodes and is thicker than the electrodes.

9 Claims, 13 Drawing Sheets

ACOUSTIC WAVE DEVICE AND FILTER

BACKGROUND OF THE INVENTION

1. Field of the Invention

The present invention relates to acoustic wave devices and filters, and more particularly, to an acoustic wave device having improved temperature characteristics and a filter using the same.

2. Description of the Related Art

A SAW (Surface Acoustic Wave) device is well known in which comb-like electrodes formed by an IDT (InterDigital Transducer) and reflection electrodes are formed in a surface of a piezoelectric substrate. An acoustic wave is excited by the comb-like electrodes and is propagated on the surface of the piezoelectric substrate. The SAW device may be characterized in that it is compact and light and is capable of attenuating an input signal greatly. Thus, the SAW device is widely used in transmission/reception filters and antenna duplexers employed in cellular phones.

Besides the SAW device, an acoustic boundary wave device has been developed in which the acoustic wave is propagated through an interface between two different media. The acoustic boundary wave device has an advantage that a foreign particle at the interface between the two media does not cause frequency variation and does not increase the electrical loss.

The recent higher performance of the cellular phones requires improvements in the temperature characteristics of the acoustic devices. Japanese Patent No. 3407459 (Document 1) discloses an acoustic wave device (hereinafter referred to as first prior art) designed to improve the temperature characteristic. FIG. 1A is a plan view of an acoustic wave device of the first prior art, and FIG. 1B is a cross-sectional view taken along a line A-A shown in FIG. 1A. Referring to FIG. 1A, comb-like electrodes 14 and reflection electrodes, which may be made of, for example, aluminum, are provided on a piezoelectric substrate made of, for example, lithium tantalate ($LiTaO_3$). For the sake of simplicity, only a small number of fingers of the electrodes 14 are illustrated in FIG. 1A. However, each of the actual electrodes 14 has a large number of fingers. The reflection electrodes 16 are also simplified in FIG. 1A. As shown in FIG. 1B, a silicon oxide ($SiO_2$) film 18 covers the comb-like electrodes 14 and the reflection electrodes 16. In FIG. 1A, the silicon oxide film 18 is omitted for the sake of simplicity. The temperature characteristic of the acoustic wave device thus formed may be improved by setting the thickness of the silicon oxide film 18 equal to or greater than $0.22\lambda$ and equal to or less than $0.38\lambda$ where $\lambda$ is the period of the comb-like electrodes 14. The acoustic wave in the above-mentioned structure is called Love wave.

Another acoustic wave device (hereinafter referred to as second prior art) has been developed. As shown in FIG. 2, the second prior art is based on the first prior art and is configured by forming an aluminum oxide ($Al_2O_3$) film 20 on the silicon oxide film 18. Energy of acoustic wave is confined between the piezoelectric substrate 12 and the silicon oxide film 18 and is propagated through the interface therebetween.

Japanese Patent Application Publication No. 52-16146 (Document 2) discloses an acoustic wave device having a structure designed to improve the temperature characteristic. The piezoelectric substrate is made of ceramic, and a titanium oxide ($TiO_2$) film is provided between the comb-like electrodes and the piezoelectric substrate.

Japanese Patent Application Publication No. 11-31942 (Document 3) discloses an electromechanical coupling coefficient of a device having a dielectric material provided below the comb-like electrodes.

The acoustic wave devices of the first and second prior arts have resonance frequencies and anti-resonance frequencies that have mutually different temperature coefficients. The temperature characteristics at the resonance and anti-resonance frequencies can be improved separately. However, it is very difficult to simultaneously improve the temperature characteristics at the resonance and anti-resonance frequencies.

SUMMARY OF THE INVENTION

The present invention has been made in view of the above circumstances, and provides an acoustic wave device having an improved temperature characteristic in which the difference between the temperature coefficient at the resonance frequency and that at the anti-resonance frequency is reduced.

According to an aspect of the present invention, there is provided an acoustic wave device includes a piezoelectric substrate, a first dielectric film provided on the piezoelectric substrate, electrodes that are provided on the first dielectric film and excite an acoustic wave, and a second dielectric film that is provided so as to cover the electrodes and is thicker than the electrodes.

According to another aspect of the present invention, there is provided a filter including at least one acoustic wave device configured as described above.

BRIEF DESCRIPTION OF THE DRAWINGS

Preferred embodiments of the present invention will be described in conjunction with the accompanying figures, in which.

DESCRIPTION OF THE PREFERRED EMBODIMENTS

A description will be given of embodiments of the present invention, in which only a few electrode fingers of comb-like electrodes and reflection electrodes are illustrated for the sake of simplicity.

First Embodiment

Figure 1A:
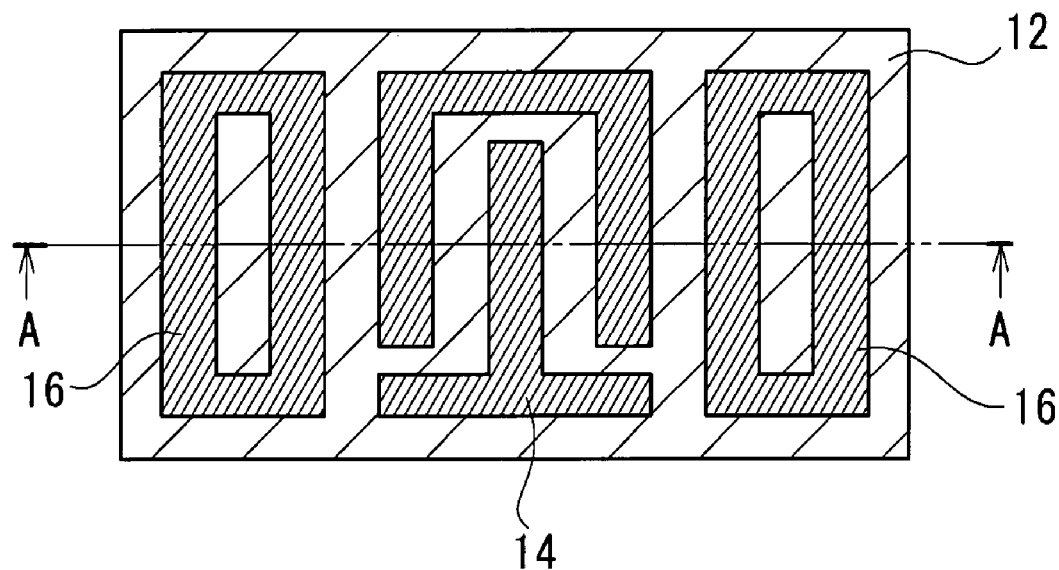
FIG. 1A is a plan view of an acoustic wave device referred to as a first prior art in the present specification.
Figure 1B:
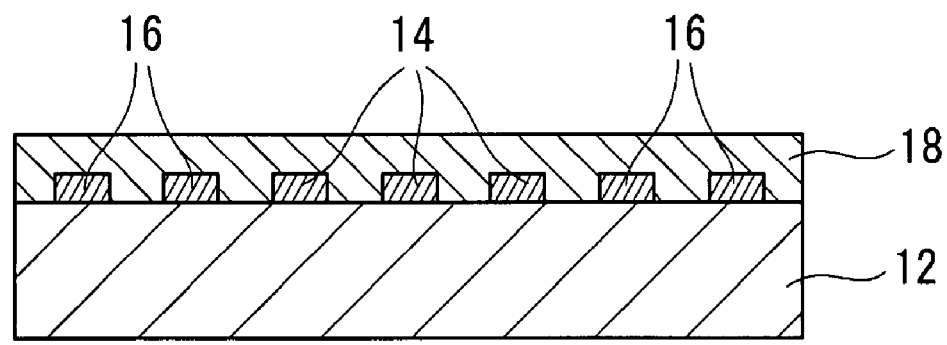
FIG. 1B is a cross-sectional view taken along a line A-A shown in FIG. 1A.
Figure 2:
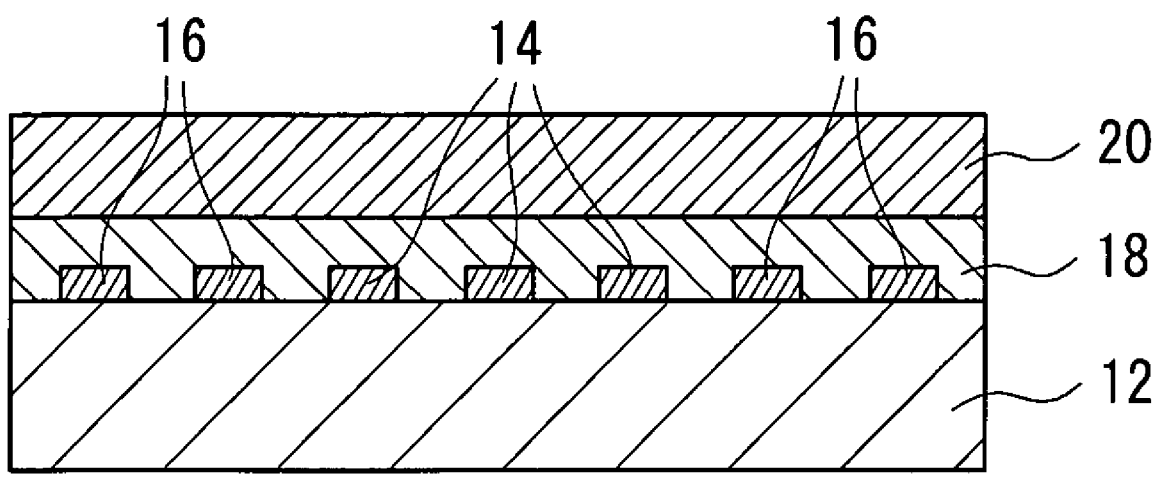
FIG. 2 is a cross-sectional view of an acoustic wave device referred as a second prior art in the specification.
Figure 3:
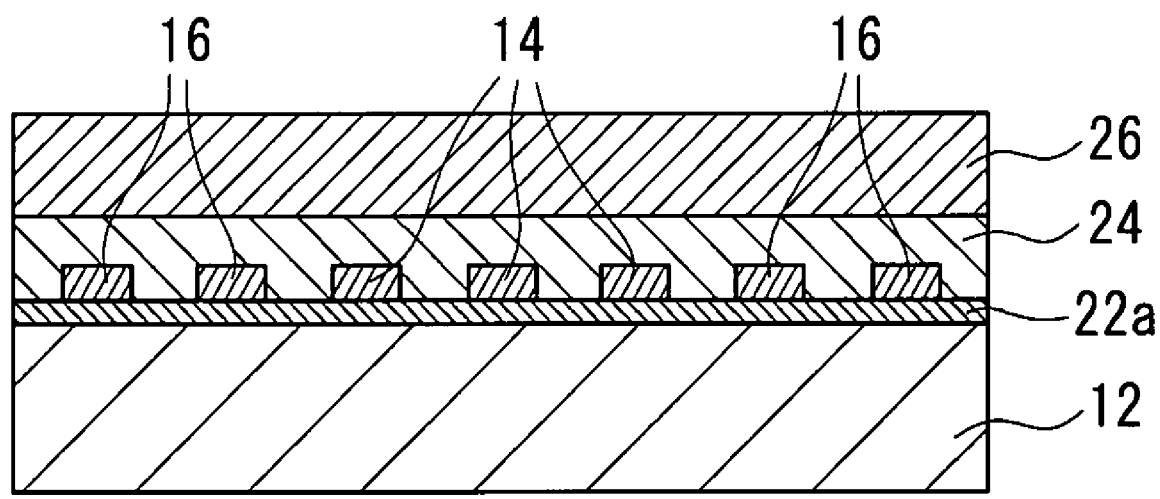
FIG. 3 is a cross-sectional view of an acoustic wave device in accordance with a first embodiment of the present invention.

FIG. 3 is a cross-sectional view of an acoustic wave device in accordance with a first embodiment of the present invention. In FIG. 3, those parts that are the same as those shown in the previously described figures are given the same reference numerals. A first dielectric film 22a is formed on the piezoelectric substrate 12 may be made of 30° Y-cut X-propagation lithium niobate ($LiNbO_3$). The first dielectric film 22a may be made of silicon oxide ($SiO_2$) and may be 10 nm thick. The comb-like electrodes 14 and the reflection electrodes 16, which may be made of copper (Cu), are provided on the dielectric film 22a at a thickness of, for example, 170 nm. A second dielectric film 24, which may be made of silicon oxide, is provided at a thickness of, for example, 1050 nm, so as to cover the comb-like electrodes 14 and the reflection electrodes 16. A third electric film 26, which may be aluminum oxide, is provided on the second dielectric film 24 at a thickness of, for example, 2 μm.

Figure 4:
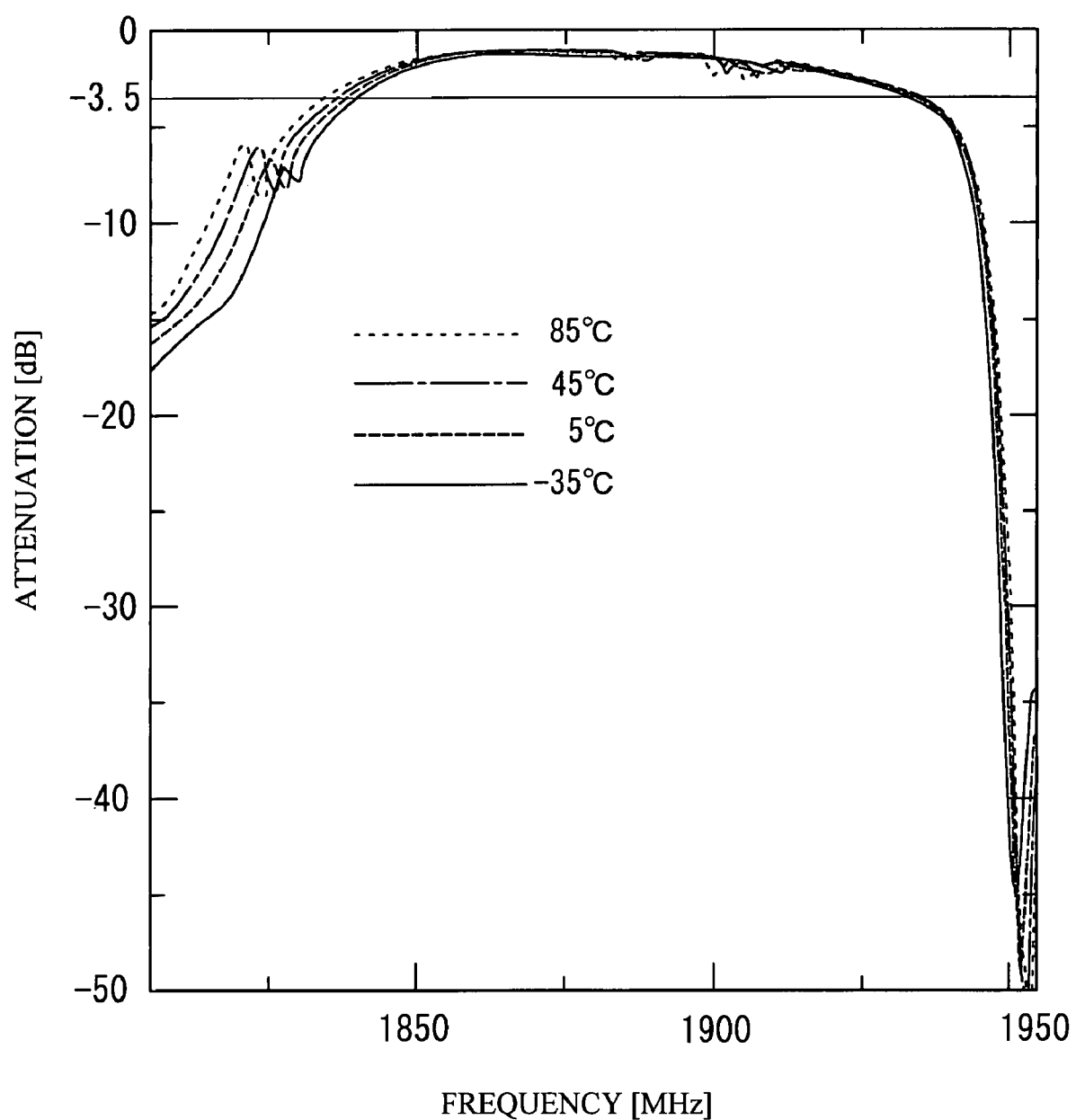
FIG. 4 is a graph of a temperature characteristic of the acoustic wave device of the second prior art.
Figure 5:
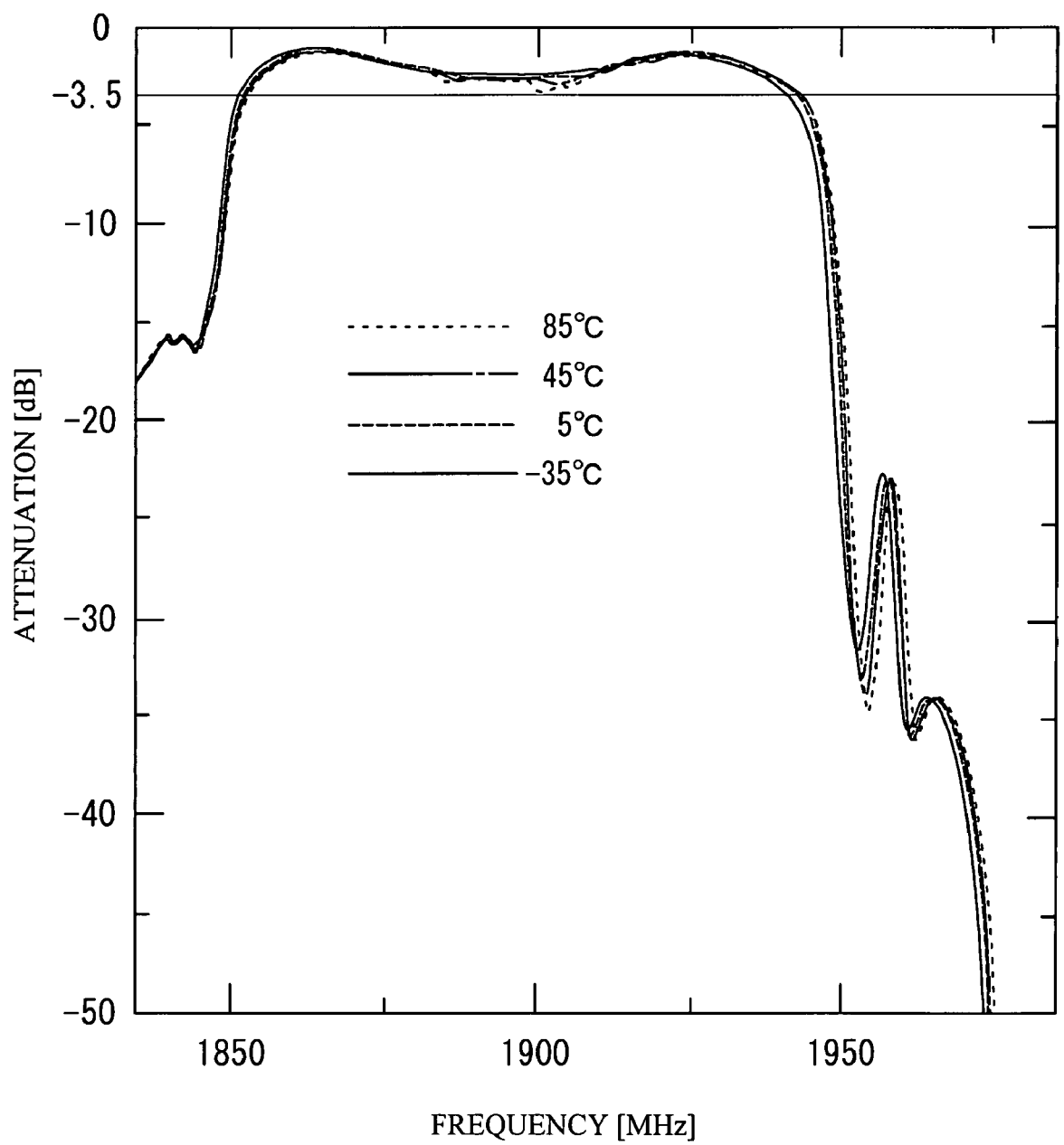
FIG. 5 is a graph of a temperature characteristic of the acoustic wave device of the first embodiment.

FIG. 4 is a graph of the temperature characteristic of a ladder filter using the acoustic wave device of the second prior art. FIG. 5 is a graph of the temperature characteristic of a ladder filter using the acoustic wave device of the first embodiment. Each of the above ladder filters has a four-stage structure in which a series resonator has a period approximately equal to 1.985 μm and a parallel resonator has a period approximately equal to 2.056 μm.

As is shown in FIG. 4, the second prior art has a frequency variation of −20.8 ppm/° C. for a temperature variation of −35° C. to +85° C. at a loss of 3.5 dB on the low-frequency side of the pass band. Further, the second prior art has another frequency variation of +5.9 ppm/° C. for a temperature variation of −35° C. to +85° C. at a loss of 3.5 dB on the high-frequency side of the pass band. Thus, the difference between the frequency variations is approximately equal to 26.7 ppm/° C.

In contrast, as is shown in FIG. 5, the first embodiment has a frequency variation of +4.9 ppm/° C. for a temperature variation of −35° C. to +85° C. at a loss of 3.5 dB on the low-frequency side of the pass band. Further, the first embodiment has another frequency variation of +5.8 ppm/° C. for a temperature variation of −35° C. to +85° C. at a loss of 3.5 dB on the high-frequency side of the pass band. Thus, the difference between the frequency variations is approximately equal to only 0.9 ppm/° C.

Figure 6:
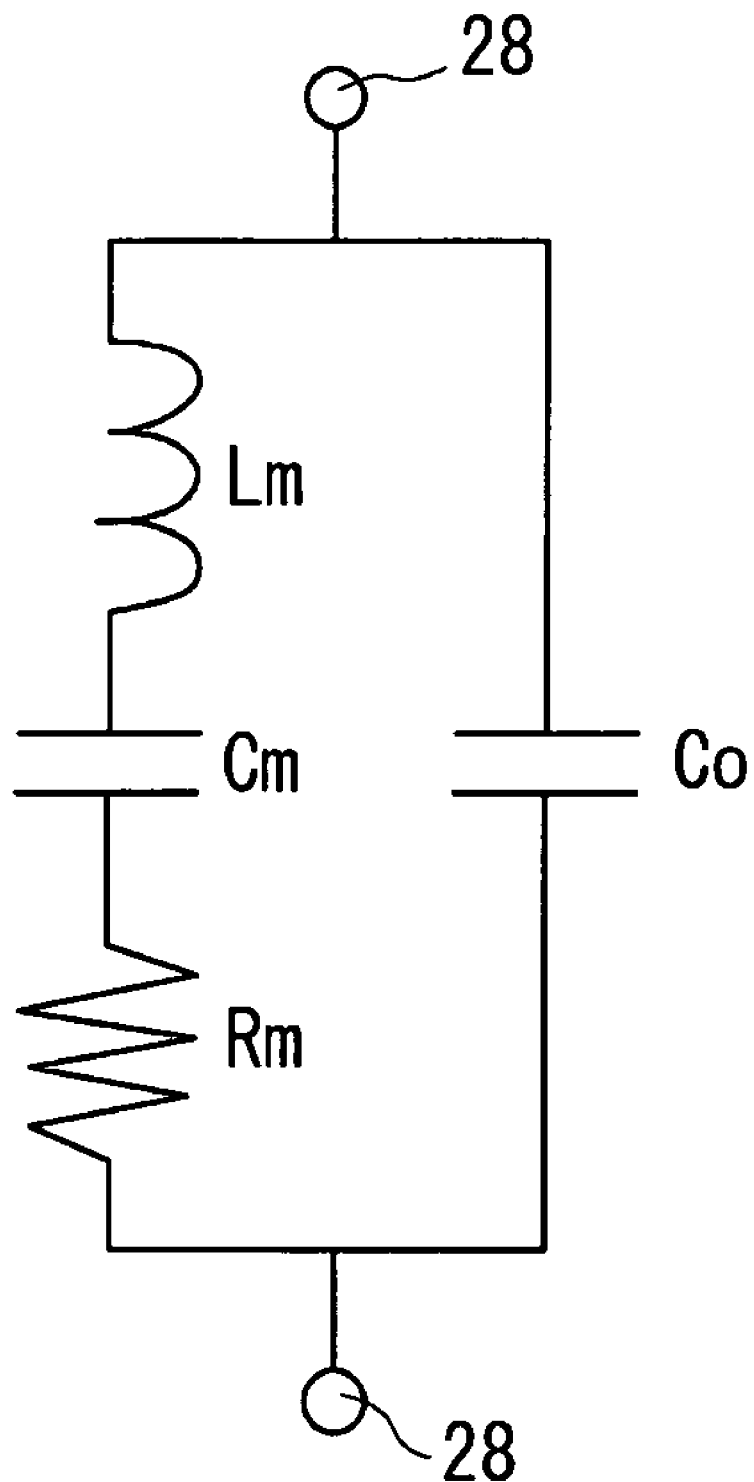
FIG. 6 is an equivalent circuit diagram of the second prior art and the first embodiment.

The acoustic wave devices of the second prior art and the first embodiment have an equivalent circuit shown in FIG. 6. Referring to FIG. 6, a series circuit composed of an inductance Lm, a capacitance Cm and a resistance Rm is connected in series between terminals 28. A further capacitance Co is connected in parallel with the series circuit. When the equivalent circuit is a pure reactance circuit without Rm, the resonance frequencies fr and the anti-resonance frequencies fa of the acoustic wave devices of the second prior art and the first embodiment are expressed as equations (1) and (2), respectively:

$$fr = \frac{1}{2\pi\sqrt{LmCm}} \quad (1)$$

$$fa = \frac{1}{2\pi\sqrt{Lm(Cm^{-1} + Co^{-1})}} \quad (2)$$

It can be seen from equation (1) that the temperature coefficient of the resonance frequency fr depends on the temperature coefficients of Lm and Cm. It can be seen from equation (2) that the temperature coefficient of the anti-resonance frequency fa depends on the temperature coefficients of Lm, Cm and Co and the magnitude of Co. It is to be noted that the temperature coefficient of the anti-resonance frequency fa depends on the temperature coefficient and magnitude of Co, while the temperature coefficient of the resonance frequency fr are independent of the temperature coefficient and magnitude of Co. Thus, there is a considerable difference between the temperature coefficient of the resonance frequency and that of the anti-resonance frequency. The above difference causes different temperature characteristics on the low-frequency side and high-frequency side of the pass band.

In the second prior art, the temperature coefficient of Co primarily depends on the temperature coefficient of the dielectric constant of lithium niobate of which the piezoelectric substrate 12 is made. Although lithium niobate has different values of dielectric constant for different orientations, it has a relative dielectric constant of approximately 40. The dielectric constant of lithium niobate has a very large temperature coefficient. Thus, the temperature coefficient of Co is large, and there is a considerable large difference between the temperature coefficient of the resonance frequency and that of the anti-resonance frequency. Therefore, as shown in FIG. 4, it is very difficult to simultaneously improve the temperature characteristic on the low-frequency side of the pass band and that on the high-frequency side thereof.

In the first embodiment, the first dielectric film 22a made of silicon oxide having a small temperature coefficient of the dielectric constant is provided between the piezoelectric substrate 12 and the comb-like electrodes 14 and the reflection electrodes 16. The relatively dielectric constant of the silicon oxide film that forms the first dielectric film 22a is approximately equal to 4.2 and is smaller than the relative dielectric constant of lithium niobate of the piezoelectric substrate 12. Thus, the first dielectric film 22a has a small value of Co. Thus, the temperature coefficient of Co in the first embodiment is influenced by the temperature coefficient of the dielectric constant of the silicon oxide film, and is smaller than that in the second prior art. Thus, the first embodiment is capable of reducing the difference between the temperature coefficient of the resonance frequency and that of the anti-resonance frequency. Thus, as shown in FIG. 5, the acoustic wave device of the first embodiment is capable of simultaneously improving the temperature characteristic on the low-frequency side of the pass band and that on the high-frequency side thereof.

Second Embodiment

Figure 7:
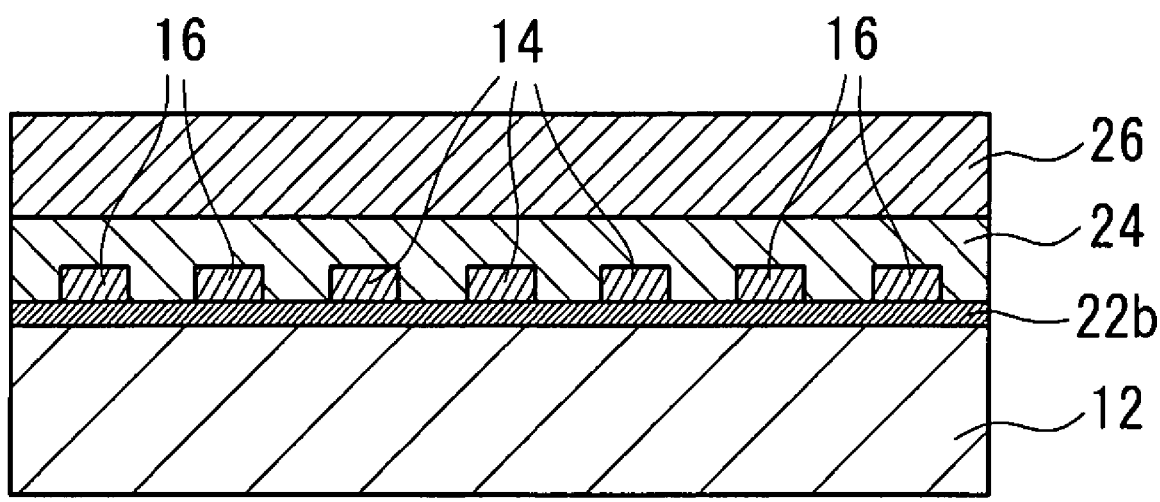
FIG. 7 is a cross-sectional view of an acoustic wave device in accordance with a second embodiment.

FIG. 7 is a cross-sectional view of an acoustic wave device in accordance with a second embodiment of the present invention. In FIG. 7, parts that are the same as those shown in the previously described figures are given the same reference numerals. Referring to FIG. 7, a first dielectric film 22b, which may be made of aluminum oxide, is provided on the piezoelectric substrate 12. The other parts of the second embodiment are the same as those of the first embodiment.

The first dielectric film 22b of aluminum oxide is provided between the piezoelectric substrate 12 and the comb-like electrodes 14 and the reflection electrodes 16. With this structure, it is possible to improve the temperature characteristic of the acoustic wave device, as in the case of the first embodiment.

The aluminum oxide film of the first dielectric film 22b has a higher resistance to dry or wet etching than the silicon oxide film. Thus, the acoustic wave device of the second embodiment can be fabricated more easily than that of the first embodiment.

Further, the relative dielectric constant of the aluminum oxide film is as large as approximately 9 and is greater than that of the silicon oxide film. The aluminum oxide film will provide the same effects as those of the silicon oxide film when the aluminum oxide film is thicker than the silicon oxide film. The thicker the film, the easier the process control. Therefore, the second embodiment can be fabricated more easily than the first embodiment.

Figure 8:
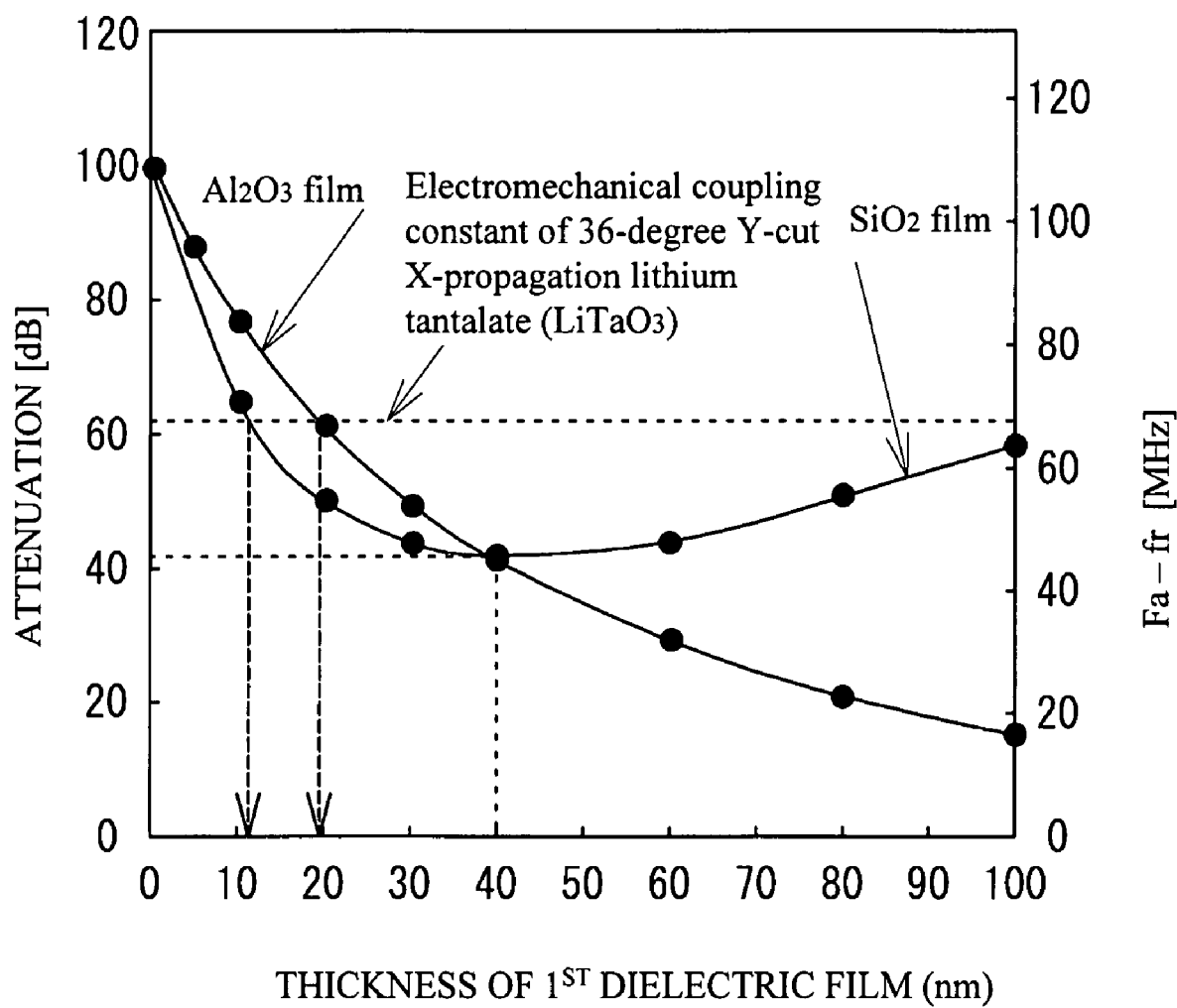
FIG. 8 is a graph showing a relationship between a film thickness and an electromechanical coupling coefficient for an aluminum oxide film and another relationship for a silicon oxide film.

FIG. 8 is a graph that shows changes of the electromechanical coupling coefficients of the devices respectively having the first dielectric films formed by the silicon oxide film and the aluminum oxide film. In FIG. 8, the electromechanical coupling coefficients are obtained from fa-fr by using the finite element method and the electromechanical coupling coefficient for a film thickness of 0 nm of the first dielectric film is 100%. The period λ of the comb-like electrodes 14 is 2 μm. The electromechanical coupling coefficient indicates the conversion efficiency from electrical energy to mechanical energy. Generally, as the electromechanical coupling coefficient is greater, the acoustic wave is more likely to be excited.

FIG. 8 shows that the electromechanical coupling coefficients of the silicon oxide film and the aluminum oxide film decrease as the thicknesses of these films increase up to 40 nm (0.02λ). The horizontal axis of the graph is the thickness of the first dielectric film, while the left vertical axis denotes a normalized electromechanical coupling coefficient (5), and the right vertical axis denotes fa-fr (MHz). The electromechanical coupling coefficient is approximately 40% for a film thickness of 40 nm (0.02λ). FIG. 8 shows that the aluminum oxide film has a smaller change rate of the electromechanical coupling coefficient to film thickness change than the silicon oxide film when the electromechanical coupling coefficient is approximately equal to or greater than 60%. In contrast, the silicon oxide film has a smaller change rate of the electromechanical coupling coefficient to film thickness change than the aluminum oxide film when the electromechanical coupling coefficient is between 40% and 60%. Further, for a film thickness of up to 40 nm (0.02λ), approximately equal electromechanical coupling coefficients can be obtained when the aluminum oxide film is thicker than the silicon oxide film. The fabrication process controllability is better as the electromechanical coupling coefficient has a smaller change rate to film thickness change and the film is thicker. Thus, it is preferable that the first dielectric film is formed by the aluminum oxide film having a small change rate of the electromechanical coupling coefficient to change in the film thickness and capable of having a large film thickness when the electromechanical coupling coefficient is equal to or greater than 60%. For an electromechanical coupling coefficient between 40% and 60%, the change rate of the electromechanical coupling coefficient to change in the film thickness can be reduced when the silicon oxide film forms the first dielectric film, and the first dielectric film can be thickened when the aluminum oxide film forms the first dielectric film. When the silicon oxide film is 40 nm (0.02λ) or thicker, the electromechanical coupling coefficient turns to increase. This is because the silicon oxide film has an increased thickness and the capacitance Co by the silicon oxide film is more dominant than Co by the piezoelectric substrate. Thus, the performance of the acoustic wave is more dependent on the silicon oxide film, and the influence of the mechanical resonance sharpness of the silicon oxide film appears. Generally, the Q value, which is the resonance sharpness of the grown silicon oxide film is worse than that of the piezoelectric substrate of a single crystal. Thus, it is not preferable that the silicon oxide film is made as thick as 40 nm (0.02λ) or more.

The general SAW filters employed in the cellular phones use an acoustic wave device having a piezoelectric substrate of 36° Y-cut X-propagation lithium tantalate (LiTaO₃). In order to obtain an electromechanical coupling coefficient as large as that of the above device, preferably, the silicon oxide film is approximately 10 nm (0.005λ) thick and the aluminum oxide film is approximately 20 nm (0.01λ) thick, as shown in FIG. 8.

In the acoustic wave devices of the first and second embodiments, the third dielectric film 26 formed by the aluminum oxide film is provided on the second dielectric film 24 formed by the silicon oxide film, wherein the aluminum oxide film has a greater acoustic velocity than that of the silicon oxide film. Thus, energy of the acoustic wave is confined in the second dielectric film 24, so that the acoustic boundary wave can be realized in which the acoustic wave is propagated through the boundary between the piezoelectric substrate 12 and the first dielectric film 22a or 22b.

Third Embodiment

Figure 9:
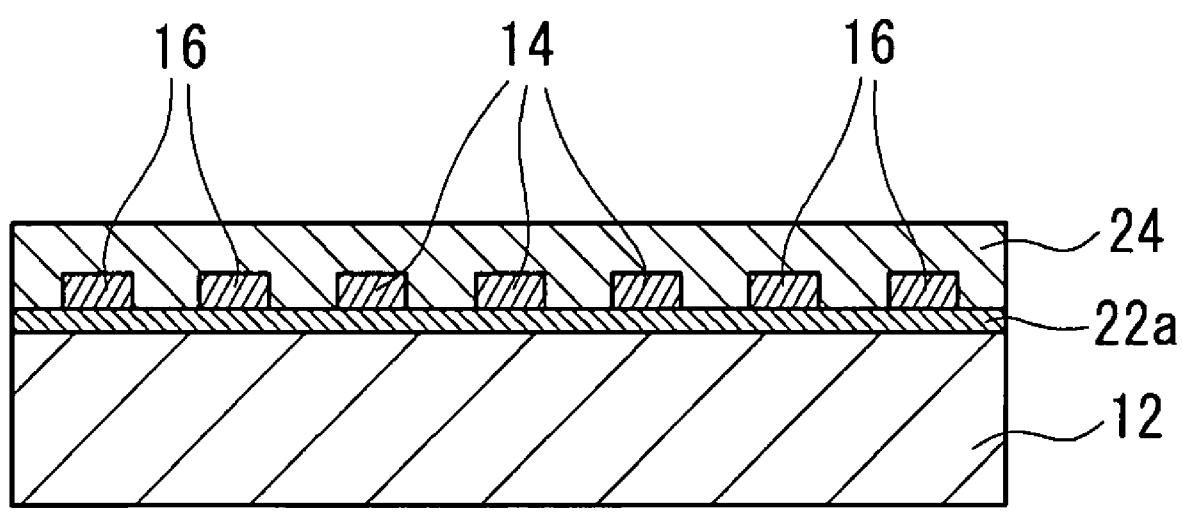
FIG. 9 is a cross-sectional view of an acoustic wave device in accordance with a third embodiment.

FIG. 9 is a cross-sectional view of an acoustic wave device in accordance with the third embodiment of the present invention. In FIG. 9, parts that are the same as those shown in the previously described figures are given the same reference numerals. The first dielectric film 22a made of, for example, silicon oxide is provided on the piezoelectric substrate 12 made of, for example, 30° Y-cut X-propagation lithium niobate. The comb-like electrodes 14 and the reflection electrodes 16 made of, for example, copper are provided on the first dielectric film 22a. The second dielectric film 24, which may be made of silicon oxide, is provided so as to cover the comb-like electrodes 14 and the reflection electrodes 16.

Since the first dielectric film 22a of silicon oxide is provided between the piezoelectric substrate 12a and the comb-like electrodes 14 and the reflection electrodes 16, the third embodiment has an improved temperature characteristic as in the case of the first embodiment.

Fourth Embodiment

Figure 10:
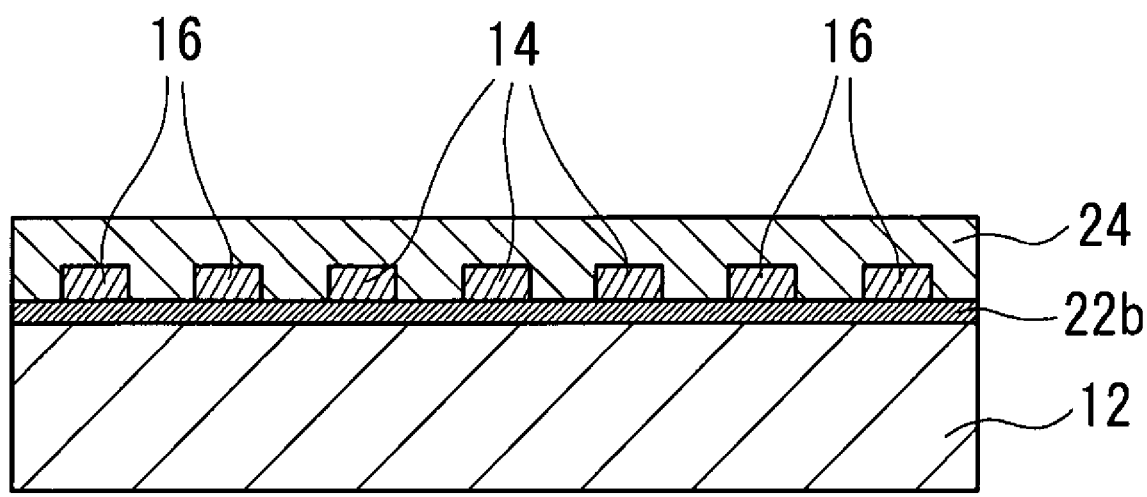
FIG. 10 is a cross-sectional view of an acoustic wave device in accordance with a fourth embodiment.

FIG. 10 is a cross-sectional view of an acoustic wave device in accordance with a fourth embodiment, which parts that are the same as those shown in the previously described figures are given the same reference numerals. The first dielectric film 22b made of, for example, aluminum oxide is provided on the piezoelectric substrate 12. The other structures of the fourth embodiment are the same as those of the third embodiment.

Since the first dielectric film 22b of aluminum oxide is provided between the piezoelectric substrate 12a and the comb-like electrodes 14 and the reflection electrodes 16, the fourth embodiment has an improved temperature characteristic as in the case of the second embodiment. In addition, the use of aluminum oxide for the first dielectric film makes it easy to fabricate the acoustic wave device in terms of resistance to etching and film thickness controllability, as compared to the third embodiment that employs the first dielectric film 22a made of silicon oxide.

The acoustic waves excited in the third and fourth embodiments are Love waves.

In the above-mentioned first through fourth embodiments, the first dielectric film 22a is made of silicon oxide, and the first dielectric film 22b is made of aluminum nitride. However, the first dielectric films 22a and 22b are not limited to these substances but may be made of another material. Preferably, the first dielectric films 22a and 22b are made of a material having a smaller temperature coefficient than that of the dielectric constant of the piezoelectric substrate 12, and may be made of silicon nitride (SiN). In addition, it is preferable that the first dielectric films 22a and 22b do not have piezoelectricity.

In the foregoing, the third dielectric film 26 is made of aluminum oxide. Alternatively, another material that has a greater acoustic velocity than that the second dielectric film 24 so that energy of the acoustic boundary wave is confined in the second dielectric film 24 and is propagated through the boundary between the piezoelectric substrate 12 and the first dielectric film 22a or 22b.

The piezoelectric substrate 12 is not limited to lithium niobate employed in the first through fourth embodiments but may be made of another material. Preferably, the piezoelectric substrate 12 is made of a material having a large electromechanical coupling coefficient, such as lithium tantalate.

Fifth Embodiment

Figure 11:
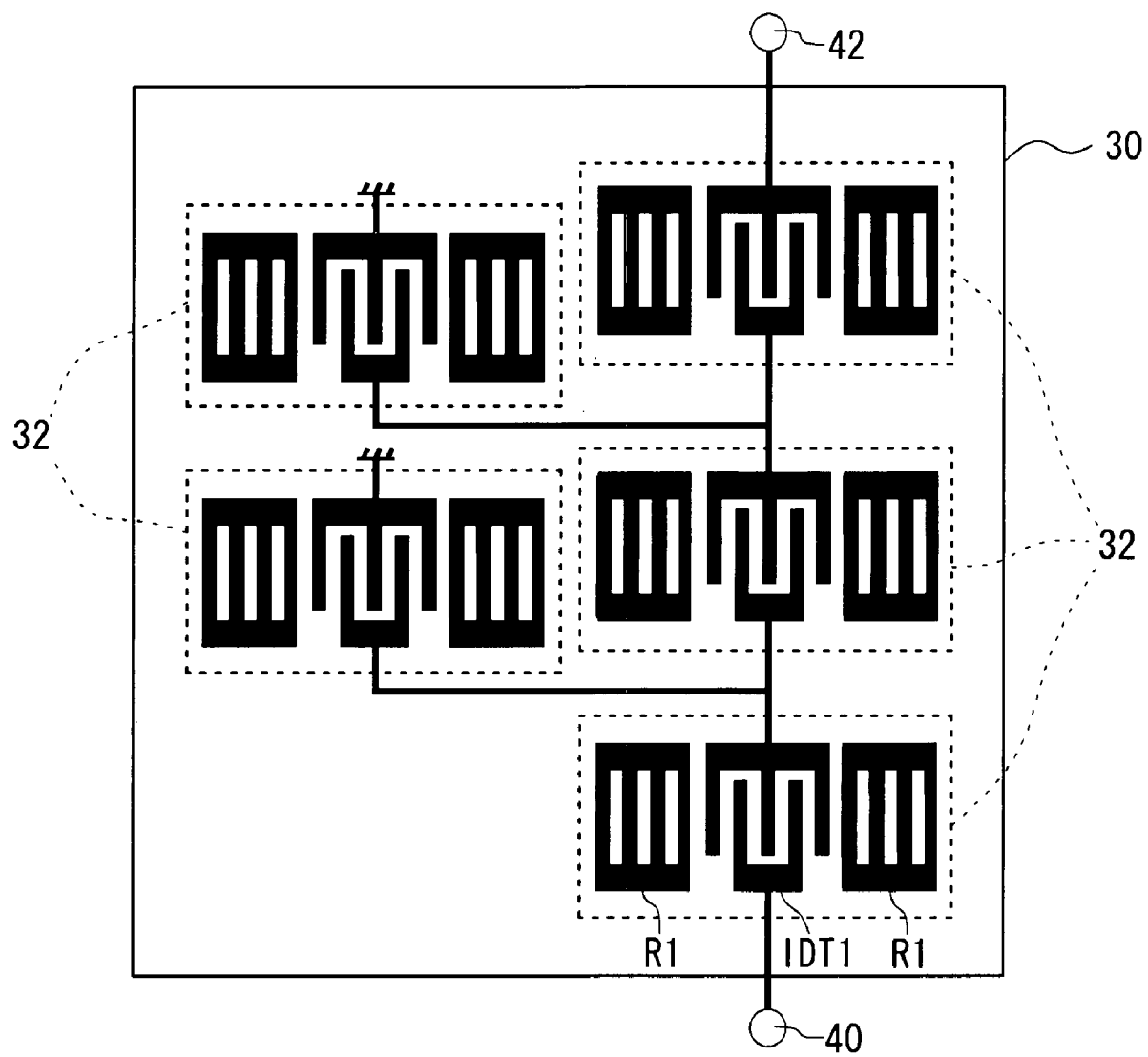
FIG. 11 schematically shows a ladder filter in accordance with a fifth embodiment.

FIG. 11 schematically illustrates a filter in accordance with a fifth embodiment. Referring to this figure, a ladder filter 30 has three one-port resonators 32 connected in series and arranged in series arms, and two one-port resonators 32 arranged in parallel arms. Each of the one-port resonators 32 is composed of a pair IDT1 of comb-like electrodes and a pair of reflection electrodes R1. The one-port resonators 32 are any of the first through fourth embodiments. One end of the ladder filter 30 is connected to a first terminal 40, which may function as an input terminal, and the other end thereof is connected to a second terminal 42, which may function as an output terminal.

Sixth Embodiment

Figure 12:
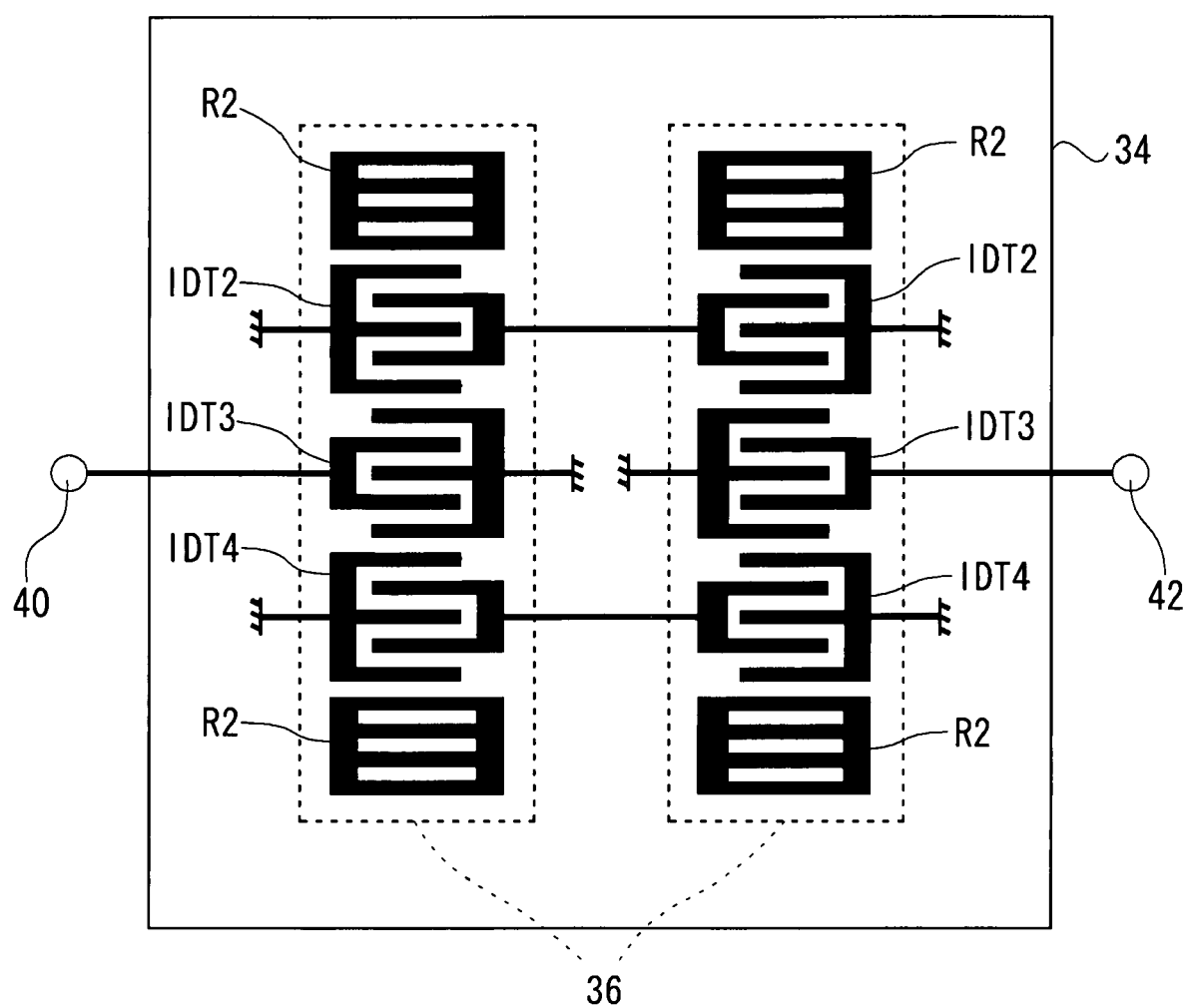
FIG. 12 schematically shows a filter having a combination of dual-mode filters of the sixth embodiment.

FIG. 12 schematically shows a filter in accordance with a sixth embodiment. Referring to this figure, a filter 34 is composed of dual-mode filters 36, each of which is made up of three IDTs. Each of the dual-mode filters 36 includes a pair of reflection electrodes R2 and three pairs IDT2, IDT3 and IDT4 of comb-like electrodes interposed between the reflection electrodes R2. The IDT3 of one of the dual-mode filters 36 is connected to the first terminal 40, and the IDT3 of the other dual-mode filter 36 is connected to the second terminal 42. The first and second terminals 40 and 42 may function as input and output terminals, respectively. The dual-mode filters 36 are any of the first through fourth embodiments. The two dual-mode filters 36 are connected in series by connecting the electrodes IDT2 of the two filters 36 and connecting the electrodes IDT4 thereof.

Seventh Embodiment

Figure 13:
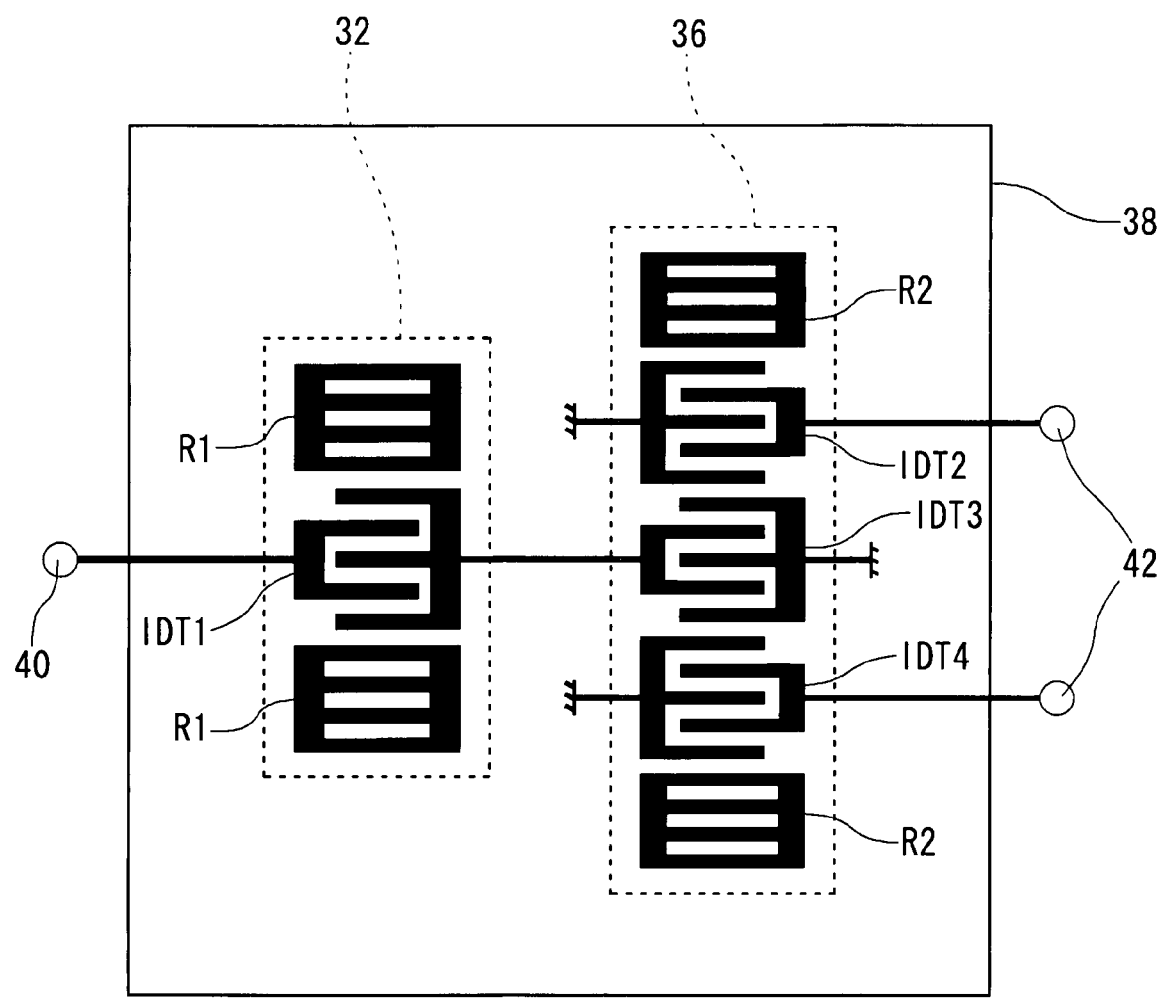
FIG. 13 schematically shows a ladder filter having a combination of a one-port resonator of the seventh embodiment and the dual-mode filter of the sixth embodiment.

FIG. 13 schematically shows a filter in accordance with a seventh embodiment. A filter 38 includes one one-port resonator 32 and one dual-mode filter 36. The one-port resonator 32 is employed in the fifth embodiment shown in FIG. 11, and the dual-mode filter 36 is employed in the sixth embodiment shown in FIG. 12. The IDT1 of the one-port resonator 32 is connected to the first terminal 40, and the IDT 2 and ID 4 of the dual-mode filter 36 are connected to the second terminals 42. The first terminal 40 may be an input terminal, and the second terminals 42 may be output terminals. The one-port resonator 32 and the dual-mode filter 36 are connected in series by connecting IDT1 of the resonator 32 to IDT 3 of the dual-mode filter 36.

According to the fifth through seventh embodiments, it is possible to provide various types of filters having improved temperature characteristics. It is possible to arbitrarily combine the filters of the fifth through seventh embodiments to produce other types of filters.

The present invention is not limited to the specifically disclosed embodiments, but other embodiments and variations may be made without departing from the scope of the present invention.

The present application is based on Japanese Patent Application No. 2006-245596 filed on Sep. 11, 2006, the entire disclosure of which is hereby incorporated by reference.

What is claimed is:

1. An acoustic wave device comprising:
   a piezoelectric substrate;
   a first dielectric film provided on the piezoelectric substrate;
   electrodes that are provided on the first dielectric film and excite an acoustic wave; and
   a second dielectric film that is provided so as to cover the electrodes and is thicker than the electrodes
   wherein the first dielectric film is disposed between the piezoelectric substrate and the electrodes, and
   wherein a temperature coefficient of a dielectric constant of the first dielectric film is smaller than that of the piezoelectric substrate.

2. The acoustic wave device as claimed in claim 1, further comprising a third dielectric film provided on the second dielectric film, wherein the third dielectric film has
   a greater acoustic velocity than that of the second dielectric film.

3. The acoustic wave device as claimed in claim 2, wherein the third dielectric film comprises aluminum oxide.

4. The acoustic wave device as claimed in claim 1, wherein the second dielectric film comprises silicon oxide.

5. The acoustic wave device as claimed in claim 1, wherein the first dielectric film comprises silicon oxide.

6. The acoustic wave device as claimed in claim 1, wherein the first dielectric film has a relative dielectric constant greater than that of silicon oxide.

7. The acoustic wave device as claimed in claim 1, wherein the first dielectric film comprises aluminum oxide.

8. The acoustic wave device as claimed in claim 1, wherein the piezoelectric substrate comprises one of lithium tantalate and lithium niobate.

9. A filter comprising acoustic wave devices, at least one of the acoustic wave devices comprising:
   a piezoelectric substrate;
   a first dielectric film provided on the piezoelectric substrate;
   electrodes that are provided on the first dielectric film and excite an acoustic wave; and
   a second dielectric film that is provided so as to cover the electrodes and is thicker than the electrodes
   wherein the first dielectric film is disposed between the piezoelectric substrate and the electrodes, and
   wherein a temperature coefficient of a dielectric constant of the first dielectric film is smaller than that of the piezoelectric substrate.

* * * * *